(12) United States Patent
Kiehlbauch et al.

(10) Patent No.: US 9,005,473 B2
(45) Date of Patent: Apr. 14, 2015

(54) GASEOUS COMPOSITIONS COMPRISING HYDROGEN FLUORIDE AND AN ALKYLATED AMMONIA DERIVATIVE

(75) Inventors: Mark W. Kiehlbauch, Boise, ID (US); J. Neil Greeley, Boise, ID (US); Paul A. Morgan, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 13/570,866

(22) Filed: Aug. 9, 2012

(65) Prior Publication Data

US 2012/0309999 A1 Dec. 6, 2012

Related U.S. Application Data

(62) Division of application No. 12/114,380, filed on May 2, 2008, now Pat. No. 8,252,194.

(51) Int. Cl.
*C07F 7/02* (2006.01)
*H01L 21/311* (2006.01)
*H01L 21/033* (2006.01)

(52) U.S. Cl.
CPC ...... *H01L 21/31116* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 4,268,279 A * | 5/1981 | Shindo et al. | 95/46 |
| 5,030,669 A * | 7/1991 | Hendrickson et al. | 523/333 |
| 5,282,295 A | 2/1994 | Oetiker | |
| 5,282,925 A | 2/1994 | Jeng et al. | |
| 5,505,816 A | 4/1996 | Barnes et al. | |
| 5,552,539 A * | 9/1996 | Duplaa et al. | 536/25.31 |
| 5,650,872 A * | 7/1997 | Saxe et al. | 359/296 |
| 5,753,305 A * | 5/1998 | Smith et al. | 427/335 |
| 5,766,971 A | 6/1998 | Ahlgren et al. | |
| 5,962,385 A * | 10/1999 | Maruyama et al. | 510/176 |
| 6,271,136 B1 | 8/2001 | Shue et al. | |
| 6,291,307 B1 | 9/2001 | Chu et al. | |
| 6,319,794 B1 | 11/2001 | Akatsu et al. | |
| 6,335,261 B1 | 1/2002 | Natzle et al. | |
| 6,656,824 B1 | 12/2003 | Hanafi et al. | |
| 6,838,347 B1 | 1/2005 | Liu et al. | |
| 6,858,532 B2 | 2/2005 | Natzle et al. | |

(Continued)

OTHER PUBLICATIONS

Greer et al, Fundamental Beam Studies of Deuterium and Fluorine Radical Reaction Kinetics on Surfaces, J. Vac. Sci. Technol., vol. 21, No. 4, Jul./Aug. 2003, pp. 1391-1402.

(Continued)

*Primary Examiner* — Allan Olsen
(74) *Attorney, Agent, or Firm* — TraskBritt

(57) ABSTRACT

A method of removing at least a portion of a silicon oxide material is disclosed. The silicon oxide is removed by exposing a semiconductor structure comprising a substrate and the silicon oxide to an ammonium fluoride chemical treatment and a subsequent plasma treatment, both of which may be effected in the same vacuum chamber of a processing apparatus. The ammonium fluoride chemical treatment converts the silicon oxide to a solid reaction product in a self-limiting reaction, the solid reaction product then being volatilized by the plasma treatment. The plasma treatment includes a plasma having an ion bombardment energy of less than or equal to approximately 20 eV. An ammonium fluoride chemical treatment including an alkylated ammonia derivative and hydrogen fluoride is also disclosed.

10 Claims, 6 Drawing Sheets

(56) References Cited

U.S. PATENT DOCUMENTS

| | | |
|---|---|---|
| 6,926,843 B2 | 8/2005 | Cantell et al. |
| 6,951,821 B2 | 10/2005 | Hamelin et al. |
| 6,986,914 B2 | 1/2006 | Elers et al. |
| 7,091,069 B2 | 8/2006 | Doris et al. |
| 7,181,306 B2 | 2/2007 | DeCrosta |
| 7,416,989 B1 | 8/2008 | Liu et al. |
| 7,585,614 B2 | 9/2009 | Furukawa et al. |
| 7,611,995 B2 | 11/2009 | Hasebe et al. |
| 7,786,016 B2 | 8/2010 | Sinha et al. |
| 7,795,148 B2 | 9/2010 | Brown |
| 8,026,180 B2 | 9/2011 | Greeley et al. |
| 2001/0053585 A1 | 12/2001 | Kikuchi et al. |
| 2003/0010040 A1* | 1/2003 | Torres et al. ............... 62/50.2 |
| 2004/0009883 A1* | 1/2004 | Ikemoto et al. ............. 510/175 |
| 2004/0079085 A1 | 4/2004 | Mancini et al. |
| 2004/0087457 A1* | 5/2004 | Korzenski et al. ........... 510/177 |
| 2004/0183100 A1 | 9/2004 | Kumagai et al. |
| 2004/0185583 A1 | 9/2004 | Tomoyasu et al. |
| 2005/0124134 A1 | 6/2005 | Hao et al. |
| 2005/0236362 A1* | 10/2005 | Aoki et al. ................ 216/57 |
| 2006/0040840 A1* | 2/2006 | Korzenski et al. ........... 510/175 |
| 2006/0043502 A1 | 3/2006 | Natzle et al. |
| 2006/0051966 A1 | 3/2006 | Or et al. |
| 2006/0084233 A1 | 4/2006 | Chang et al. |
| 2006/0196527 A1 | 9/2006 | Nishimura et al. |
| 2006/0219660 A1* | 10/2006 | Nishimura et al. ........... 216/67 |
| 2006/0251874 A1* | 11/2006 | McClure et al. ............. 428/210 |
| 2007/0066005 A1 | 3/2007 | Hieda et al. |
| 2007/0251551 A1* | 11/2007 | Korzenski et al. ............ 134/41 |
| 2008/0125342 A1* | 5/2008 | Visintin et al. .............. 510/175 |
| 2008/0142483 A1 | 6/2008 | Hua et al. |
| 2008/0160210 A1 | 7/2008 | Yang et al. |
| 2008/0214002 A1* | 9/2008 | Aoki et al. .................. 438/682 |
| 2008/0233709 A1 | 9/2008 | Conti et al. |
| 2008/0318392 A1 | 12/2008 | Hung et al. |
| 2009/0017627 A1 | 1/2009 | Greeley et al. |
| 2009/0192065 A1* | 7/2009 | Korzenski et al. ........... 510/176 |
| 2009/0301996 A1* | 12/2009 | Visintin et al. ............... 216/13 |
| 2010/0112199 A1* | 5/2010 | McClure et al. ............. 427/180 |
| 2010/0112728 A1* | 5/2010 | Korzenski et al. .............. 438/3 |
| 2011/0117751 A1* | 5/2011 | Sonthalia et al. ............. 438/753 |
| 2011/0287577 A1 | 11/2011 | Stewart et al. |
| 2013/0072411 A1* | 3/2013 | Wojtczak et al. ............. 510/175 |

OTHER PUBLICATIONS

Haring et al., Reactivity of a Fluorine Passivated Silicon Surface, J. Vac. Sci. Technol., vol. 10, No. 4, Jul./Aug. 1992, pp. 802-805.

Quirk et al., Semiconductor Manufacturing Technology, Prentice Hall (2001), pp. 207-210.

Vetter et al., Improvement of Crystalline Silicon Surface Passivation by Hydrogen Plasma Treatment, Applied Physics Letters, vol. 84, No. 9, Mar. 1, 2004, pp. 1474-1476.

* cited by examiner

FIG. 1A  FIG. 1B

GASEOUS COMPOSITIONS COMPRISING HYDROGEN FLUORIDE AND AN ALKYLATED AMMONIA DERIVATIVE

CROSS-REFERENCE TO RELATED APPLICATION

This application is a divisional of U.S. patent application Ser. No. 12/114,380, filed May 2, 2008, now U.S. Pat. No. 8,252,194, issued Aug. 28, 2012, the disclosure of which is hereby incorporated herein by this reference in its entirety.

TECHNICAL FIELD

Embodiments of the invention relate to fabricating semiconductor structures and, more specifically, to removing silicon oxide from semiconductor structures.

BACKGROUND

Chemical Oxide Removal ("COR") is a gaseous process known in the art to selectively remove silicon oxides ("$SiO_x$") by reacting gaseous ammonia ("$NH_3$") and hydrogen fluoride ("HF") to produce $NH_4F_x$. The $NH_3$ and HF react with silicon oxide on a semiconductor wafer to form ammonium hexafluorosilicate ("$(NH_4)_2SiF_6$"). This reaction is referred to herein as a "chemical treatment" and is typically conducted in a reaction chamber. The semiconductor wafer is then transferred to a different chamber and heated, producing nitrogen ("$N_2$"), water ("$H_2O$"), silicon tetrafluoride ("$SiF_4$"), and $NH_3$, which are volatile and evaporate from the surface of the semiconductor wafer. Heating the semiconductor wafer is referred to herein as a "post heat treatment ("PHT")." Alternatively, the $(NH_4)_2SiF_6$ is removed using a deionized ("DI") water rinse. The combination of the chemical treatment and the PHT is referred to herein as the "COR/PHT process." The COR/PHT process is marketed under the tradename CERTAS® by Tokyo Electron Limited. Additional $NH_3$/HF-based chemistries for etching oxides are marketed by ULVAC Technologies, Inc. (Methuen, Mass.) and Applied Materials, Inc. (Santa Clara, Calif.). Systems for conducting the COR/PHT process are known in the art. These systems include two chambers, one for conducting the chemical treatment and one for conducting the PHT. Semiconductor wafers undergoing the COR/PHT process are transported from one chamber to the other, which adds time to the wafer fabrication process and decreases wafer throughput.

U.S. Pat. No. 6,951,821 discloses using the COR/PHT process to trim an oxide hard mask. The chemical treatment includes exposing the oxide hard mask to $NH_3$ and HF and the PHT includes heating the oxide hard mask to a temperature within a range of 20° C.-200° C. The COR/PHT process etches a thermal oxide at greater than 10 nm per 60 seconds of chemical treatment and tetraethyl orthosilicate ("TEOS") at greater than 10 nm per 180 seconds of chemical treatment. The COR/PHT process has also been used to selectively remove small amounts (1 nm-30 nm) of silicon oxides, such as a native oxide or a thermal oxide, relative to polysilicon. United States Patent Application Publication No. 2006/0196527 discloses using the COR/PHT process to remove $SiO_2$ in a pre-metal-silicon contact formation cleaning, to remove $SiO_2$ before a silicon epitaxial process, or to remove $SiO_2$ from a polysilicon wafer before depositing a silicide metal.

Furthermore, U.S. Pat. No. 7,091,069 discloses using a plasma or vapor of HF and $NH_3$ to remove a sacrificial oxide layer on a silicon-on-insulator ("SOI") metal oxide semiconductor field effect transistor ("MOSFET"). U.S. Pat. No. 6,656,824 discloses using a plasma or vapor of HF and $NH_3$ to remove a sacrificial oxide layer in a MOSFET. The plasma or vapor of HF and $NH_3$ produces undercuts beneath silicon spacers formed on sidewalls of a dielectric layer of the MOSFET. U.S. Pat. No. 6,838,347 discloses etching concave portions of an oxide hardmask at a reduced rate relative to convex portions using a plasma or vapor of HF and $NH_3$. Additionally, attempts have been made to reduce line defects on oxide-based mask lines by eliminating undesirable curves and protrusions, such as whiskers, using the COR/PHT process.

United States Patent Application Publication No. 2006/0051966 discloses a method of removing oxides from a substrate and cleaning a processing chamber used to remove the oxides. The oxides are removed using a dry etchant that includes a mixture of $NH_3$ and nitrogen trifluoride ("$NF_3$"). A plasma of the $NH_3/NF_3$ mixture is generated and reacts with the oxides, forming $(NH_4)_2SiF_6$. To remove the $(NH_4)_2SiF_6$, the substrate is elevated in the processing chamber and annealed using a heated distribution plate, which provides thermal energy to dissociate the $(NH_4)_2SiF_6$ into volatile species. The processing chamber is periodically cleaned using high heat conductivity gases and heat or using a plasma.

Accordingly, what is needed in the art are methods of removing silicon oxides from semiconductor wafers enabling improved wafer throughput.

BRIEF DESCRIPTION OF THE DRAWINGS

FIGS. 1A-1C are cross-sectional views of a semiconductor structure during various stages of fabrication in accordance with an embodiment of the invention;

DETAILED DESCRIPTION

Figure 1C:
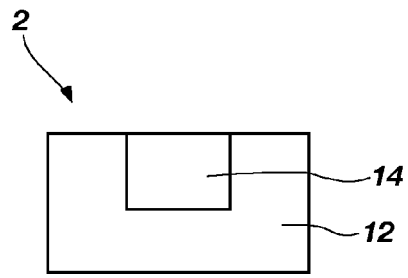
Figure 1C:
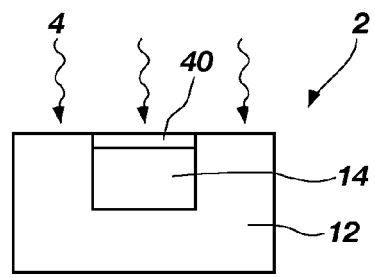
Figure 1C:
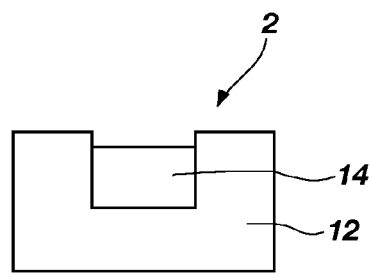

A method of removing at least a portion of a silicon oxide material is disclosed. As shown in FIGS. 1A-1C, a semiconductor structure 2 including a substrate 12 and a silicon oxide 14 ("$SiO_x$") is provided. A surface of the silicon oxide 14 is exposed to an ammonium fluoride chemistry, forming a solid reaction product 40 on the surface of the silicon oxide 14. As described in more detail below, the ammonium fluoride chemistry includes a volatile amine and HF. The reaction of the volatile amine and HF with the silicon oxide 14 is referred to herein as "ammonium fluoride chemical treatment" to distinguish this reaction from the chemical treatment of the conventional COR/PHT process. The solid reaction product 40 and silicon oxide 14 are exposed to a plasma 4, producing volatile species that are easily removed from a processing chamber (not shown) in which the plasma 4 is produced. Subjecting the silicon oxide 14 and the solid reaction product 40 to the plasma 4 is referred to herein as the "plasma treatment." By converting a portion of the silicon oxide 14 to the solid reaction product 40 and volatilizing the solid reaction product 40, that portion of the silicon oxide 14 may be removed. The ion bombardment energy of the plasma 4 may be adjusted such that the solid reaction product 40 is removed without removing the unreacted silicon oxide 14. To distinguish the process including the ammonium fluoride chemical treatment and the plasma treatment according to various embodiments of the invention from the conventional COR/PHT process, the former is referred to herein as the "ammonium fluoride chemical treatment/plasma treatment" process.

The following description provides specific details, such as material types and processing conditions in order to provide a thorough description of embodiments of the invention. However, a person of ordinary skill in the art will understand that these and other embodiments of the invention may be practiced without employing these specific details. Indeed, embodiments of the invention may be practiced in conjunction with conventional fabrication techniques employed in the industry. In addition, the semiconductor structures described below do not form a complete semiconductor device and the description provided below does not form a complete process flow for manufacturing the semiconductor device. Only those process acts and semiconductor structures necessary or desirable to understanding the embodiments of the invention are described in detail below. Additional acts to form the semiconductor device from the semiconductor structures may be performed by conventional fabrication techniques, which are, therefore, not described herein.

As used herein, the term "silicon oxide" means and includes silicon dioxide ("$SiO_2$"), silicon oxide ("SiO"), TEOS, a silicon-rich silicon oxynitride, atomic layer deposition ("ALD") SiO or $SiO_2$, or other silicon oxide-based material. The silicon oxide 14 may be present on a surface of a substrate 12 or in a trench or other opening formed in a surface of a substrate 12. FIGS. 1A-1C, 3A-3C, and 4A-4C illustrate the silicon oxide 14 present in an opening in a substrate 12 and FIGS. 2A-2D illustrate the silicon oxide 14 present on the surface of a substrate 12. If the silicon oxide 14 is present in the opening in a substrate, the opening may have an aspect ratio (ratio of depth of the feature to width thereof) of less than or equal to approximately 20:1.

As used herein, the term "substrate" means and includes a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, or indium phosphide.

To remove the silicon oxide 14, the semiconductor structure 2 including the substrate 12 and the silicon oxide 14 may be exposed to the ammonium fluoride chemical treatment under appropriate conditions for the silicon oxide and the ammonium fluoride chemistry to react and form the solid reaction product 40, as shown in FIG. 1B. The ammonium fluoride chemistry may include a gaseous mixture of at least one volatile amine and HF, which react with each other and with the silicon oxide 14 to form the solid reaction product 40. The volatile amine may be $NH_3$ or an alkylated derivative or alkylated analog of $NH_3$, such as methyl amine, dimethyl amine, trimethyl amine, ethyl amine, diethyl amine, triethyl amine, isopropyl amine, dipropyl amine, n-propyl amine, n-butyl amine, sec-butyl amine, t-butyl amine, or combinations thereof. The gaseous mixture may, optionally, include an inert carrier gas, such as argon, xenon, neon, helium, or combinations thereof. The ammonium fluoride chemical treatment may be conducted in a processing chamber under appropriate process conditions for the reaction between the volatile amine, the HF, and the silicon oxide 14 to occur.

The semiconductor structure 2 may be placed in a processing apparatus and subjected to the ammonium fluoride chemical treatment, during which a portion of the silicon oxide 14 on the substrate 12 is converted to the solid reaction product 40. The processing apparatus may be configured to conduct both the ammonium fluoride chemical treatment and the plasma treatment in situ. The processing apparatus may be a conventional plasma chamber, such as an inductively coupled plasma chamber, modified to include gas supply lines for supplying the gases of the ammonium fluoride chemical treatment. The processing apparatus may include a vacuum chamber, a mounting table with a support (e.g., wafer chuck) for the semiconductor structure 2 comprising substrate 12, gas supply lines for the volatile amine and HF, gas supply lines for plasma-generating gases, a gas dispenser (e.g., a shower head) with a heating element to control the temperature of plasma-generating gas or gases, multiple openings leading from the gas dispenser for introducing the plasma-generating gas or gases into the vacuum chamber, at least one gas discharge port for removing gas from the vacuum chamber, a cooling channel for circulating a coolant into the mounting table to maintain the semiconductor structure 2 comprising substrate 12 at a desired temperature, a power source, and electrodes. The power source and electrodes may be used to convert the supplied gas or gases into a plasma including reactive species and to maintain the gas or gases as reactive species. Plasma chambers are known in the art and, therefore, are not described in additional detail herein. Processing apparatuses useful in practicing embodiments of the invention are commercially available from various sources, such as from Applied Materials, Inc. (Santa Clara, Calif.).

The volatile amine and HF for effecting an ammonium fluoride chemical treatment may be flowed into the processing apparatus through the gas supply lines and through the openings. Without being bound by any theory, it is believed that the volatile amine and HF react with one another and with the silicon oxide 14 to form the solid reaction product 40. By way of non-limiting example, if the ammonium fluoride chemistry includes a gaseous mixture of $NH_3$ and HF, $(NH_4)_2SiF_6$ is produced as the solid reaction product 40. The $NH_3$ and HF are believed to react with one another to form $NH_4F_x$, which reacts with the silicon oxide 14 to form $(NH_4)_2SiF_6$. Without being bound by any theory, it is believed that the mechanism for removing the silicon oxide 14 is effected by diffusion of the ammonium fluoride chemistry into the silicon oxide 14. As such, the removal of the silicon oxide 14 is diffusion limited (self-limiting) and controllable. As a thickness of the solid reaction product 40 on the silicon oxide 14 increases, the solid reaction product 40 functions as a barrier to gradually block and reduce diffusion of the $NH_4F_x$, $NH_3$, and/or HF into the silicon oxide 14, which slows the rate of reaction and eventually terminates the ammonium fluoride chemical treatment. If $(NH_4)_2SiF_6$ is already present on the silicon oxide 14, the $NH_3$ and HF may diffuse through the previously formed $(NH_4)_2SiF_6$ to the underlying silicon oxide 14 and react to form additional $(NH_4)_2SiF_6$. By way of non-limiting example, if the ammonium fluoride chemistry includes a gaseous mixture of an alkylated $NH_3$ derivative ($R_xNH_{3-x}$, where x is an integer greater than or equal to 1) and HF, an alkylated derivative of $(NH_4)_2SiF_6$, $((NR_xH_{4-x})_2SiF_6$, where x is an integer greater than or equal to 1), is produced as the solid reaction product 40, where R is an alkyl group, such as methyl, ethyl, propyl, or butyl. For example, if the ammonium fluoride chemistry includes methyl amine and HF, the alkylated derivative $(CH_3—NH_3)_2SiF_6$ may be faulted as the solid reaction product 40.

During the ammonium fluoride chemical treatment, the vacuum chamber may be maintained under appropriate conditions for the silicon oxide 14 to be converted to the solid reaction product 40. The amount of silicon oxide 14 that is converted during the ammonium fluoride chemical treatment may depend on at least one of the flow rate of the volatile amine and HF, the pressure in the vacuum chamber, the temperature within the vacuum chamber, and the exposure time. The gaseous mixture may include an equal volume of HF and the volatile amine, or a greater volume of the HF relative to the volatile amine. By way of non-limiting example, a volumetric flow rate ratio of the HF to the volatile amine in the gaseous mixture may be within a range of from approximately 1/1 to approximately 1/2. The flow range of $NH_3$ and HF may be in the range of approximately 20 sccm to approximately 50 sccm. If an inert carrier gas is present, the gaseous mixture of the HF and the volatile amine may account for from approximately 0.05% by volume to approximately 20% by volume of the total volume of the gaseous mixture and the inert carrier gas.

By way of non-limiting example, the pressure within the vacuum chamber during the ammonium fluoride chemical treatment may be maintained within a range of from approximately $6.7 \times 10^{-2}$ Pa to approximately 4.0 Pa (from approximately 0.5 mTorr to approximately 30 mTorr). By way of non-limiting example, the temperature within the vacuum chamber may be maintained within a range of from approximately 10° C. to approximately 30° C., such as at approximately room temperature (approximately 25° C.). The silicon oxide 14 may be exposed to the ammonium fluoride chemical treatment for an amount of time sufficient to enable conversion of the silicon oxide 14 to the solid reaction product 40. By way of non-limiting example, the exposure time may be within a range of from approximately 30 seconds to approximately 300 seconds, such as from approximately 90 seconds to approximately 120 seconds.

To remove the solid reaction product 40, the substrate 12 may be subjected to the plasma treatment in the vacuum chamber. Before conducting the plasma treatment, the vacuum chamber may be purged, such as with the inert gas, to remove excess reactants from the ammonium fluoride chemistry. The plasma treatment may cause the solid reaction product 40 to decompose into volatile species, which are evacuated from the vacuum chamber. The plasma 4 generated by the plasma treatment may be a low energy plasma 4 produced from at least one gas supplied through one or more of gas supply lines and termed for convenience a "plasma-generating gas." The plasma 4 may be produced by conventional techniques, such as by striking a plasma 4 (see FIG. 1B) in the vacuum chamber. The plasma 4 may include reactive species of the plasma-generating gases. By way of non-limiting example, the plasma-generating gas may be at least one inert gas, a mixture of the inert gas and a halogenated gas, hydrogen ("$H_2$"), a mixture of the inert gas and hydrogen, or oxygen ("$O_2$"). The inert gas may include, but is not limited to, argon, xenon, neon, helium, or combinations thereof. The halogenated gas may include at least one of chlorine ("$Cl_2$") and bromine ("$Br_2$").

In one embodiment, the plasma-generating gases include argon and $Cl_2$. In another embodiment, the plasma-generating gas includes $O_2$. If an alkylated $NH_3$ derivative is used as the volatile amine, producing an alkylated derivative of $(NH_4)_2SiF_6$ as the solid reaction product 40, carbon residues from the alkylated derivative of $(NH_4)_2SiF_6$ may be produced on the surface of the semiconductor structure 2. The PHT process (conventional heat treatment) described above may be ineffective at removing the carbon residues. However, since an $O_2$ plasma enables the formation of volatile carbon dioxide ("$CO_2$") from the carbon residues, the $O_2$ plasma may be used to remove the alkylated derivative of $(NH_4)_2SiF_6$ and the carbon residues. The $O_2$ plasma may also be used to remove $(NH_4)_2SiF_6$.

In an additional embodiment, the plasma-generating gas includes $H_2$. In addition to removing the solid reaction product 40, using the $H_2$ plasma may provide improved surface passivation to a silicon substrate. In other words, using the $H_2$ plasma may achieve, in situ, removal of the solid reaction product 40 and passivation of the silicon substrate. As such, a single vacuum chamber may be used to both remove the solid reaction product 40 and provide the improved passivation of the silicon substrate. Using the $H_2$ plasma as the plasma treatment may increase the number of hydrogen-terminated surfaces on the silicon substrate, improving passivation, because hydrogen-terminated silicon surfaces are more resistant to oxidation than fluorine-terminated silicon surfaces. Hydrogen-terminated silicon surfaces are also more stable than fluorine-terminated silicon surfaces, which may form volatile $SiF_x$ compounds, where x is from 1 to 4. Without being bound by any particular theory, it is believed that surface passivation is increased with use of the $H_2$ plasma via fluorine abstraction of the fluorine-terminated surfaces of the silicon substrate. Additionally, using the $H_2$ plasma may enable the solid reaction product 40 to be removed at a low energy and without use of aggressive etch chemistries that may incorporate into the silicon substrate. In contrast, conventional HF vapor etch methods are known to produce fluorine-terminated surfaces on the silicon substrate. In addition, conventional, fluorine-based, dry etch methods for removing oxides are known to produce roughening of the silicon surface, diffusion of fluorine into the silicon substrate, residues on the surface of the silicon substrate, and liberation of $O_2$ from quartz components in the vacuum chamber.

The vacuum chamber may be maintained at appropriate conditions for the low energy plasma 4 to be generated and maintained from the plasma-generating gases. These conditions may include, but are not limited to, the temperature and pressure within the vacuum chamber. By way of non-limiting example, the temperature within the vacuum chamber may be maintained within a range of from approximately −10° C. to approximately 80° C. The pressure within the vacuum chamber may be maintained within a range of from approximately 10 mTorr to approximately 500 mTorr, such as at approximately 200 mTorr. In addition, the flow rate of the plasma-generating gases may be adjusted. By way of non-limiting example, if the inert gas is used as the plasma-generating gas, the flow rate of the inert gas may be maintained within a range of from approximately 100 standard cubic centimeters per minute ("sccm") to approximately 1000 sccm. If the plasma 4 is generated from the mixture of the inert gas and the halogenated gas, the flow rate of the halogenated gas may be maintained within a range of from approximately 10 sccm to approximately 200 sccm and the flow rate of the inert gas may be maintained within a range of from approximately 100 sccm to approximately 1000 sccm. If the plasma 4 is generated from the mixture of the inert gas and hydrogen, the flow rate of the inert gas may be maintained within a range of from approximately 100 sccm to approximately 1000 sccm and the flow rate of the hydrogen may be maintained within a range from approximately 10 sccm to approximately 200 sccm.

During the plasma treatment, the ion bombardment energy of the plasma 4 may be maintained at less than or equal to approximately 20 eV, such as from approximately 1 eV to approximately 20 eV. Use of an ion bombardment energy within this range may help to reduce damage to the substrate and/or other exposed materials. Without being bound by any theory, it is believed that the energy used to decompose the solid reaction product 40 may be provided by the ion bombardment energy of the plasma 4. The ion bombardment energy of the plasma 4 may be used to fluorinate the solid reaction product 40. By way of non-limiting example, if the solid reaction product 40 is $(NH_4)_2SiF_6$, exposure to the plasma 4 may form $(NF_yH_{4-y})_2SiF_6$, where y is from 1 to 4. As the value of y increases, volatile products of the solid reaction product 40 may form and desorb or may be sputtered by ion impact. As such, removing the solid reaction product 40 is not dependent on heat or a thermal act, but rather on a non-thermal act. In addition, without being bound by any theory, it is believed that the selectivity of the plasma treatment for the solid reaction product 40 over the silicon oxide 14 is provided by maintaining the ion bombardment energy within a range of from approximately 1 eV to approximately 20 eV. The activation energy for decomposing the solid reaction product 40 is greater than or equal to approximately 1 eV. However, the activation energy for removing silicon oxide 14 by physical sputtering is greater than approximately 20 eV. Therefore, by exposing the solid reaction product 40 to the plasma 4 having an ion bombardment within this range, the solid reaction product 40 may be removed without removing the silicon oxide 14. While plasmas have been used in other aspects of semiconductor fabrication processing, these plasmas typically have a higher ion bombardment energy, such as greater than approximately 20 eV. As such, the use of the plasma 4 having an ion bombardment energy in the range of from approximately 1 eV to approximately 20 eV is unexpectedly low for a semiconductor fabrication process.

Exposing the solid reaction product 40 to the plasma 4 may cause the solid reaction product 40 to decompose and form volatile species, such as $N_2$, $H_2O$, $SiF_4$, $CO_2$, $NH_3$, or combinations thereof. These volatile species may be evacuated from the vacuum chamber under vacuum or by using a purge gas. By exposing the semiconductor structure 2 to the plasma 4, at least a portion of the silicon oxide 14 converted to the solid reaction product 40 may be anisotropically etched, as shown in FIG. 1C. By way of non-limiting example, the silicon oxide 14 may be removed at a rate of from approximately 0.1 nm/second to approximately 20 nm/second.

After volatilization of the solid reaction product 40, the vacuum chamber may be purged, such as with the inert carrier gas. The semiconductor structure 2 may then be subjected to an additional ammonium fluoride chemical treatment, as previously described, forming another solid reaction product 40 on the silicon oxide 14. The solid reaction product 40 may be subjected to the plasma treatment, as previously described, to remove another portion of the silicon oxide 14. By subjecting the semiconductor structure 2 to multiple cycles of the ammonium fluoride chemical treatment and plasma treatment, a desired amount of the silicon oxide 14 may be removed from the substrate 12. However, for the sake of convenience and clarity, only one cycle of the ammonium fluoride chemical treatment and plasma treatment is illustrated in each of FIGS. 1A-1C and 3A-4C.

Since the chemical treatment and the plasma treatment are conducted in a single processing apparatus, a wafer transport act is eliminated during fabrication of a semiconductor device formed from the semiconductor structure 2. As such, wafer throughput may be increased. By way of non-limiting example, the wafer throughput enabled using processing according to embodiments of the invention may range from approximately 30 wafers/hour to approximately 50 wafers/hour. In contrast, the throughput of wafers subjected to the conventional COR/PHT process described previously is limited to approximately 20 wafers/hour.

To further increase the selectivity of the plasma treatment for the solid reaction product 40 versus the silicon oxide 14, the temperature within the vacuum chamber may be maintained at a lower level than is possible when using a conventional COR/PHT process. Since the activation energy for decomposing the solid reaction product 40 is provided by the ion bombardment energy of the plasma 4, not thermal energy, the temperature of the semiconductor structure 2 during the ammonium fluoride chemical treatment/plasma treatment process may be maintained at a lower temperature than during the conventional COR/PHT process. In the conventional COR/PHT process, the activation energy used to decompose the solid reaction product 40 is produced from heat, or thermal energy. As such, the solid reaction product 40 is thermally decomposed. While the solid reaction product 40 is removed by the conventional COR/PHT process, another material having an activation energy greater than that of the solid reaction product 40 may inadvertently be removed from a substrate subjected to this conventional processing.

Therefore, use of the ammonium fluoride chemical treatment/plasma treatment process may prevent or eliminate inadvertent removal of other materials exposed to the plasma treatment. Since the activation energy is supplied by the ion bombardment energy of the plasma 4, the vacuum chamber may be maintained at a lower temperature compared to the temperature used during the conventional COR/PHT process. Additionally, the radical species generated by the plasma 4 do not depend on external activation energy from a heat source. Therefore, the decomposition of the solid reaction product 40 may proceed without thermal stimulation.

As previously described, the ammonium fluoride chemical treatment/plasma treatment process may be used to selectively remove at least a portion of the silicon oxide 14 from a semiconductor structure 2. Specific embodiments in which the ammonium fluoride chemical treatment/plasma treatment process may be used are described below. However, the ammonium fluoride chemical treatment/plasma treatment process is not limited to use in these embodiments. Rather, the ammonium fluoride chemical treatment/plasma treatment process may be used in any situation where selective removal of at least a portion of the silicon oxide is desired.

Figure 2A:
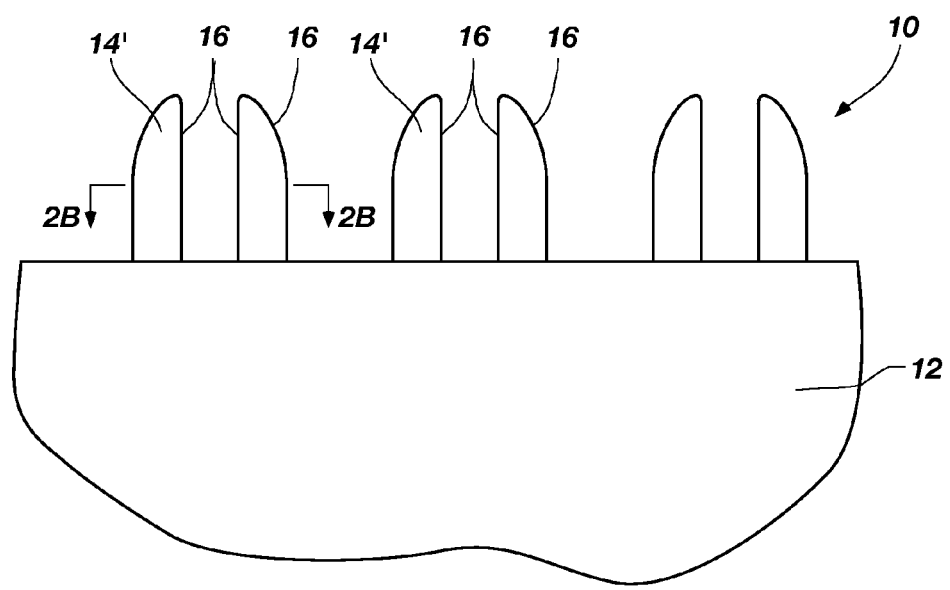
FIG. 2A is a side view of a semiconductor structure during fabrication in accordance with an embodiment of the invention and FIGS. 2B-2D are cross-sectional views of the semiconductor structure depicted in FIG. 2A, taken along line 2B-2B.

In one embodiment, the ammonium fluoride chemical treatment/plasma treatment process may be used to reduce line width roughness ("LWR") or line edge roughness ("LER") of spacers formed from silicon oxide 14, as illustrated in FIGS. 2A-2D. FIG. 2A illustrates a semiconductor structure 10 including the substrate 12 having a hardmask composed of a pattern of oxide spacers 14' thereon. The hardmask is present in the form of free-standing lines or spacers (e.g., oxide spacers 14') extending in a spaced, generally parallel relation to one another. The oxide spacers 14' may be formed from SiO, $SiO_2$, ALD SiO, ALD $SiO_2$, TEOS, or silicon-rich silicon oxynitride. The oxide spacers 14' may be formed as described in U.S. patent application Ser. No. 11/777,005, filed on Jul. 12, 2007, now U.S. Pat. No. 8,026,180, issued on Sep. 27, 2011, the entire disclosure of which is incorporated herein by reference.

Figure 2B:
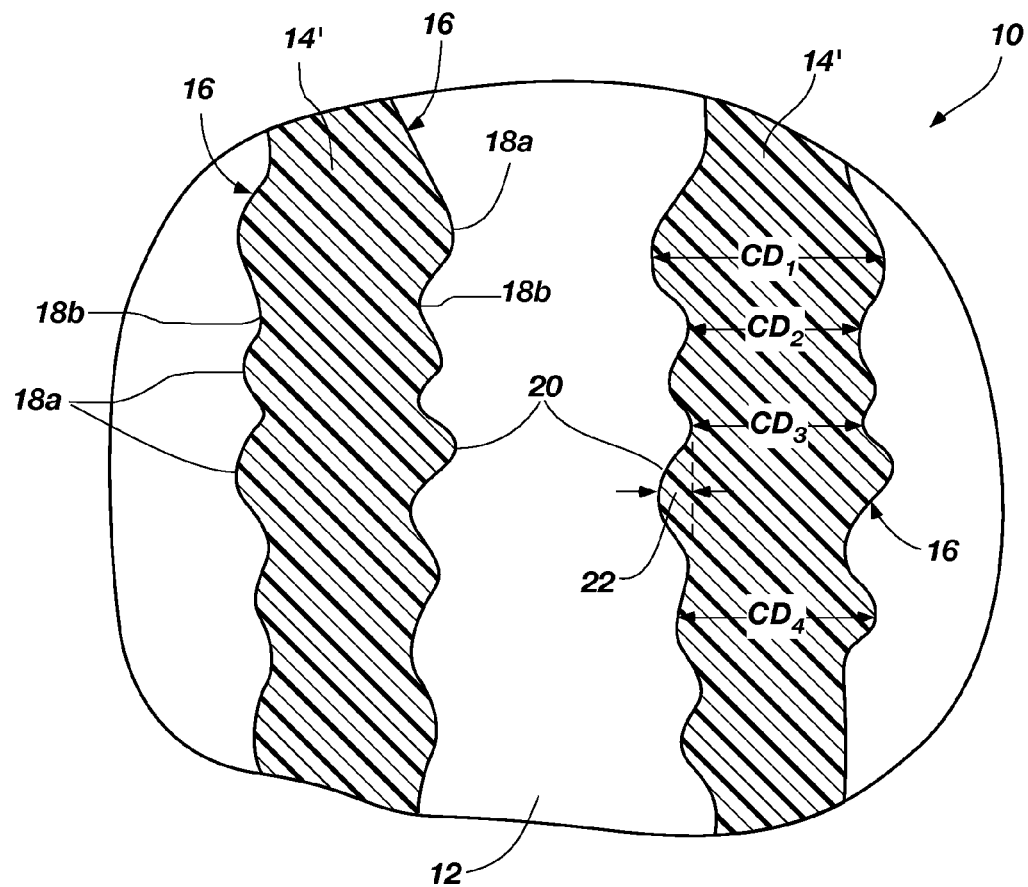

The oxide spacers 14' are formed to have a desired width or critical dimension ("CD"), such as, for example, from approximately 25 nm to approximately 50 nm, or from approximately 10 nm to approximately 20 nm. Since oxide spacers 14' are formed on sidewalls of a patterned photoresist (not shown) or other material (not shown) by ALD, the conformal nature of the deposition process results in a transfer of the LWR that is present in the patterned photoresist to the oxide spacers 14'. As illustrated in FIG. 2B, the oxide spacers 14' exhibit an LWR or deviation of CD (width), denoted as $CD_{1-4}$, along the length of the oxide spacer 14' due to a profile of an edge 16 of the oxide spacers 14' that is non-uniform and wavy with peaks 18a (convex or elevated surface features) and valleys 18b (concave or recessed surface features) along the vertical surfaces or sidewalls 20 and a variable peak-to-valley (or convex-to-concave) LWR amplitude 22. By way of non-limiting example, the peaks 18a may have a thickness or amplitude 22 of approximately 5 nm or less.

To decrease the LWR/LER, the oxide spacers 14' may be subjected to the ammonium fluoride chemical treatment/plasma treatment process of an embodiment previously described. By way of non-limiting example, the ammonium fluoride chemical treatment is described herein as using $NH_3$, HF, and argon, and the plasma treatment is described as using argon and $Cl_2$. However, each of these treatments may include other gases, as previously described. The ammonium fluoride chemical treatment/plasma treatment process may be conducted to achieve selective removal of small scale topography of the oxide spacers 14' (versus trimming of the oxide spacers 14' in bulk), for example, to reduce or eliminate the peaks 18a of oxide spacers 14', thus reshaping and straightening the profile of the edges 16.

Figure 2C:
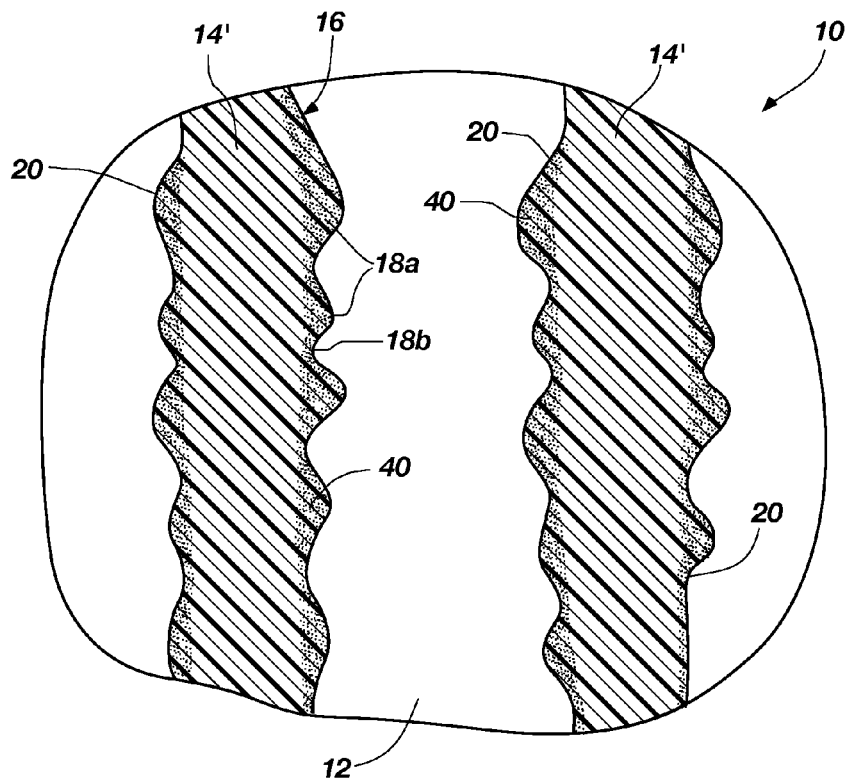

The semiconductor structure 10 may be placed in the vacuum chamber and $NH_3$, HF, and argon introduced into the vacuum chamber. The ammonium fluoride chemical treatment may be used to convert the peaks 18a to the solid reaction product 40, as illustrated in FIG. 2C. The ammonium fluoride chemical treatment may be conducted under conditions that include a gas flow rate for each gas ($NH_3$, HF) of from approximately 20 sccm to approximately 50 sccm; a gas flow rate for the inert carrier gas (argon) of from approximately 20 sccm to approximately 40 sccm; a $NH_3$:HF flow rate (sccm) ratio of from approximately 2:1 to approximately 1:2; a partial pressure (pp) of HF of from approximately 5 mTorr to approximately 10 mTorr; an HF vapor temperature of from approximately 20° C. to approximately 70° C.; a gas pressure within the vacuum chamber of from approximately 10 mTorr to approximately 30 mTorr; a lid/wall chamber temperature of from approximately 60° C. to approximately 80° C.; a stage (substrate) temperature of from approximately 25° C. to approximately 45° C.; and an exposure time of from approximately 30 seconds to approximately 5 minutes.

Figure 2D:
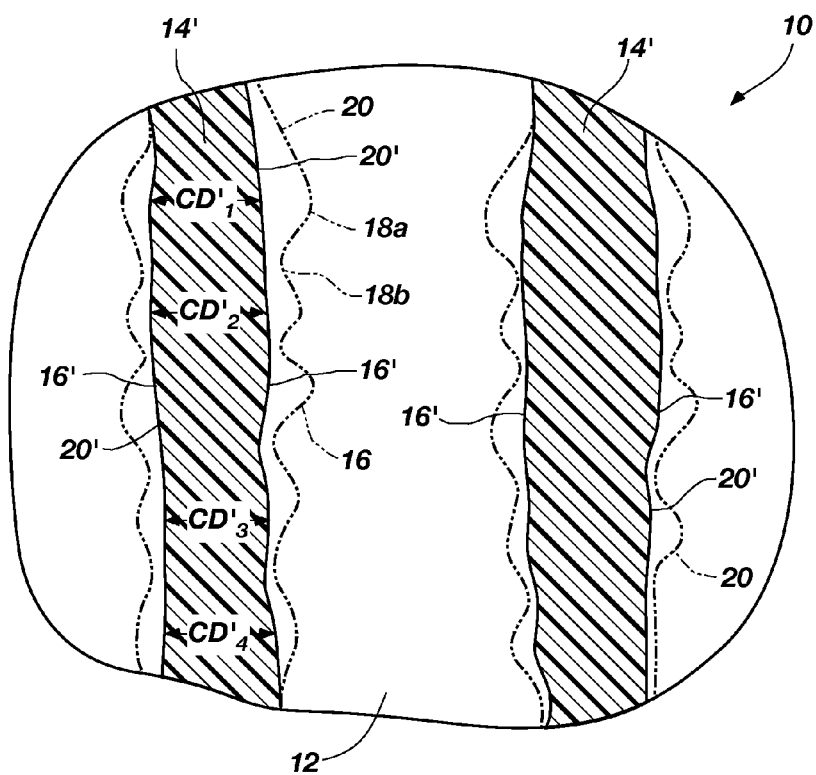

As illustrated by the dashed line in FIG. 2D, the solid reaction product 40 may be removed by subjecting the oxide spacers 14' to plasma treatment in an embodiment of the process. Since the ammonium fluoride chemical treatment included $NH_3$ and HF, the solid reaction product 40 is $(NH_4)_2SiF_6$. The argon and $Cl_2$ may be flowed into the vacuum chamber and an argon/$Cl_2$ plasma (not shown) generated. As the solid reaction product 40 is exposed to the argon/$Cl_2$ plasma, the $(NH_4)_2SiF_6$ may be decomposed into $N_2$, $H_2O$, $SiF_4$, $NH_3$, or combinations thereof and evacuated from the vacuum chamber. The oxide spacers 14' may be subjected to additional cycles of the ammonium fluoride chemical treatment and the plasma treatment until a desired amount of the oxide spacers 14' is removed. By converting the peaks 18a of the oxide spacers 14' to $(NH_4)_2SiF_6$ and decomposing the $(NH_4)_2SiF_6$ to form volatile species, the peaks 18a may be removed, reducing the LWR/LER of the oxide spacers 14'. The oxide spacers 14' exhibit a deviation of CD, denoted as $CD'_{1-4}$, after removing the peaks 18a.

After removing the peaks 18a, the semiconductor structure 10 may be further processed as described in U.S. patent application Ser. No. 11/777,005, now U.S. Pat. No. 8,026, 180. Because the ammonium fluoride chemical treatment/plasma treatment process is diffusion limited, there is generally faster (and greater) etching of more exposed convex areas (peaks 18a) than less exposed concave areas (valleys 18b) along the sidewalls 20 (edges 16) of the oxide spacers 14' compared to a planar surface, resulting in a greater thickness of the solid reaction product 40 (FIG. 2C) formed in the peaks 18a over a fixed time period. The higher or accelerated etch rate of higher surface areas (peaks 18a) than valleys 18b results in effective removal of convex or protruding peaks 18a. Embodiments of the invention can thus be used to reduce or eliminate LWR and/or LER of the oxide spacers 14' by laterally planarizing the sidewalls 20 of the oxide spacers 14' to reduce the peak-to-valley LWR amplitude 22 (FIG. 2B) to a desired edge profile for a more consistent CD measurement along the length of the oxide spacers 14', and to achieve smoother edges 16' and sidewall 20' surfaces.

Figure 3A:
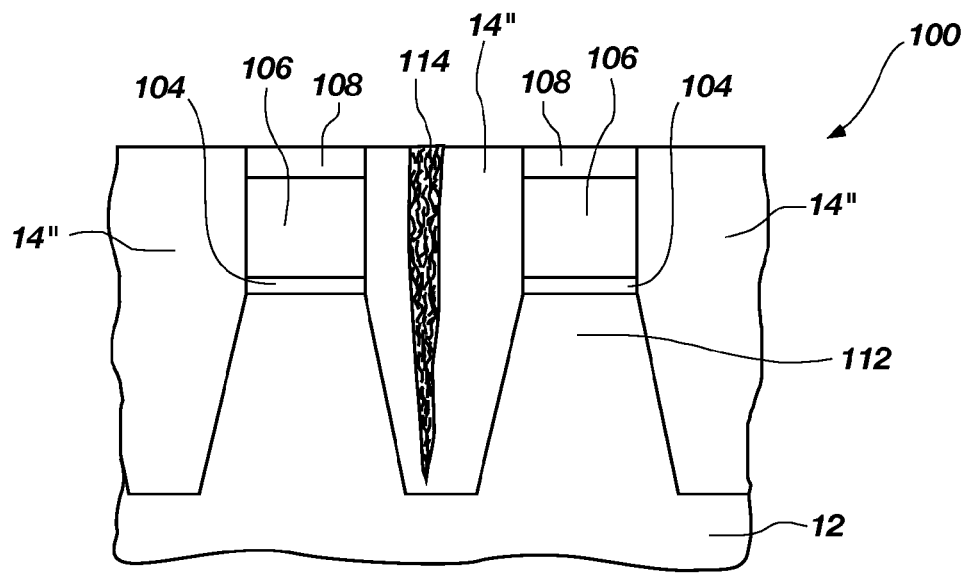
FIGS. 3A-3C are cross-sectional views of a semiconductor structure in accordance with an embodiment of the invention, during various stages of fabrication.
Figure 3B:
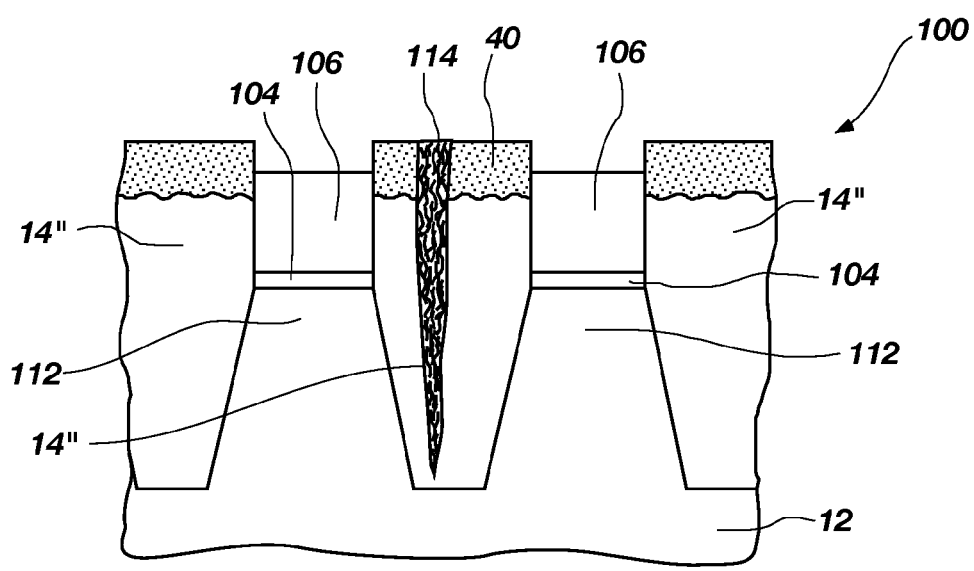
Figure 3C:
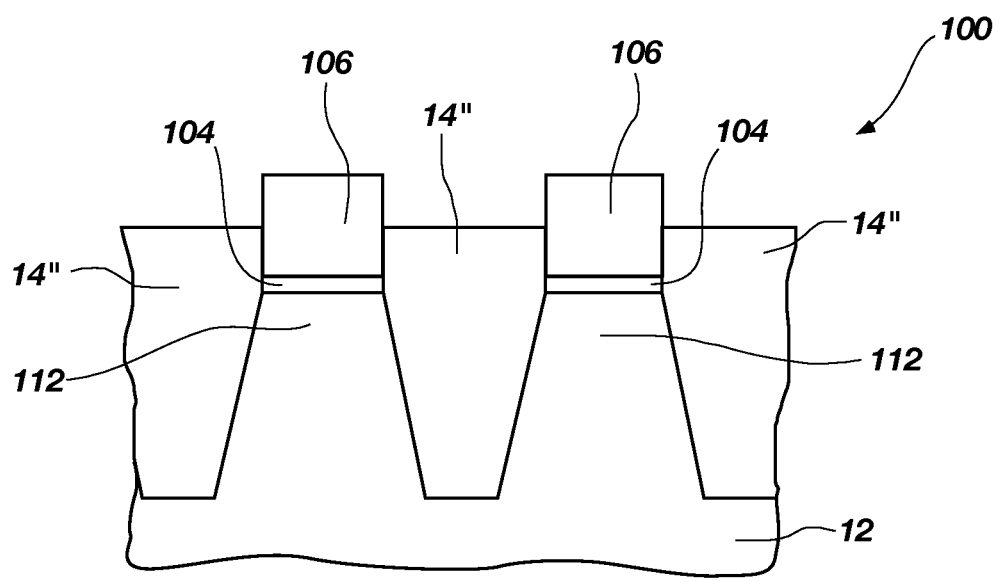

In another embodiment, the ammonium fluoride chemical treatment/plasma treatment process may be used to remove silicon oxide 14 from a shallow trench isolation ("STI") region 14", as illustrated in FIGS. 3A-3C. The STI region 14" includes at least one cavity 114 therein. The presence of the at least one cavity 114 affects substantially uniform removal of the silicon oxide 14. A memory array including the STI region 14" may be formed by conventional techniques, which are not discussed in detail herein. FIG. 3A illustrates a semiconductor structure 100 after several processing acts have already been conducted. The semiconductor structure 100 may include a substrate 12 having a first dielectric material 104 thereon, a first conductive material 106 on the first dielectric material 104, a hardmask 108 on the first conductive material 106, the STI region 14", an active region 112, and the at least one cavity 114. The semiconductor structure 100 is as described in U.S. patent application Ser. No. 11/652,218, filed on Jan. 11, 2007, now U.S. Pat. No. 7,786,016, issued on Aug. 31, 2010, the entire disclosure of which is incorporated herein by reference.

The hardmask layer 108 may be removed by conventional techniques, exposing an upper surface of the first conductive material 106 of each of the active regions 112, as shown in FIG. 3B. A portion of the STI regions 14" of the semiconductor structure 100 may be removed, even though the cavity 114 is present, so that the upper surface of the STI regions 14" lies below the upper surface of the first conductive material 106. The STI regions 14" may be anisotropically etched without substantially removing other exposed layers, such as first conductive material 106. The portion of the STI regions 14" may be removed by exposing the silicon oxide 14 of the STI regions 14" to the ammonium fluoride chemical treatment and forming the solid reaction product 40. The chemical treatment may include $NH_3$ and HF, but is not limited thereto. After the reaction is complete, the semiconductor structure 100 may be subjected to the plasma treatment to remove the solid reaction product 40. The plasma 4 (FIG. 1B) may be an argon/$Cl_2$ plasma, but is not limited thereto. The plasma 4 may cause the solid reaction product 40 to decompose into $N_2$, $H_2O$, $SiF_4$, $CO_2$, $NH_3$, or combinations thereof, which are exhausted from the vacuum chamber. FIG. 3C illustrates the semiconductor structure 100 after removal of the solid reaction product 40. The exposed portion of the STI regions 14" may be exposed to multiple cycles of the ammonium fluoride chemical treatment and the plasma treatment to remove the desired amount of the silicon oxide 14 from the STI regions 14".

After the desired amount of the STI regions 14" is removed, additional material may be formed or disposed on the semiconductor structure 100, as known in the art and as described and illustrated, for example, in U.S. patent application Ser. No. 11/652,218, now U.S. Pat. No. 7,786,016, the entire disclosure of which is incorporated herein by reference, to produce a memory device, such as a NAND FLASH memory device.

Figure 4A:
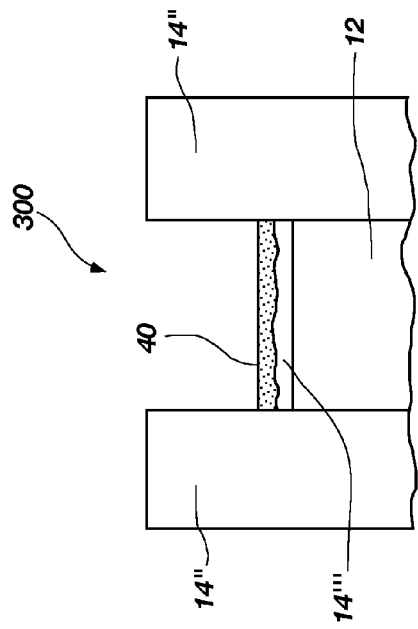
FIGS. 4A-4C are cross-sectional views of a semiconductor structure in accordance with an embodiment of the invention, during various stages of fabrication.
Figure 4B:
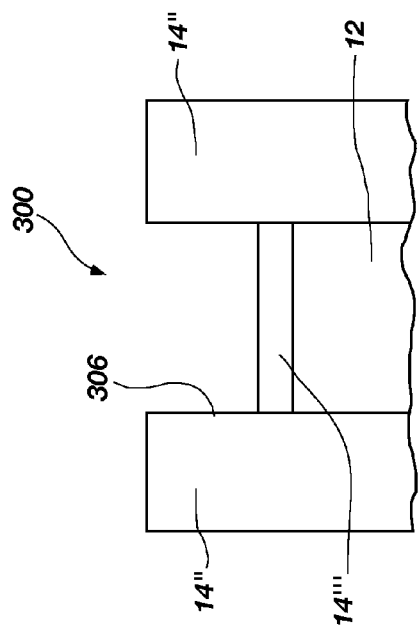
Figure 4C:
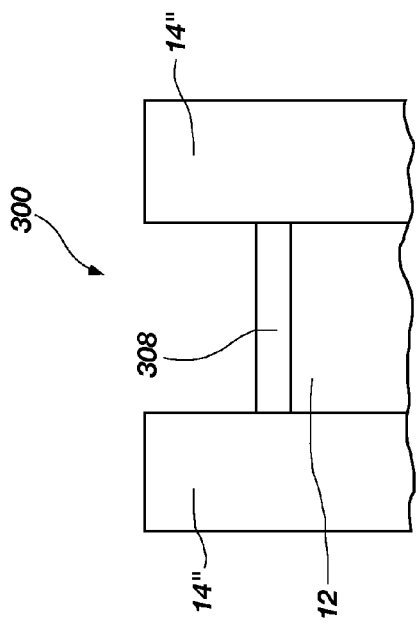

In another embodiment, the ammonium fluoride chemical treatment/plasma treatment process may be used to remove a sacrificial oxide without substantially removing an isolation oxide, as shown in FIGS. 4A-4C. FIG. 4A shows semiconductor structure 300 in a reverse flow process for fabricating a memory device, such as a NAND FLASH memory device. The semiconductor structure 300 may include an exposed sacrificial material 14''', at least one exposed STI region 14'', and a semiconductor substrate 12. The sacrificial material 14''' may be formed from silicon oxide, such as a sacrificial oxide. The STI region 14'' may be formed from silicon oxide, such as an isolation oxide. The sacrificial material 14''' may be in contact with the STI regions 14'' and may function as a mask to protect the underlying semiconductor substrate 12.

The sacrificial material 14''' may be substantially removed without substantially removing the STI region 14''. For instance, the sacrificial material 14''' may be removed without forming divots or "J-hooks" in the STI region 14''. In other words, sidewalls 306 of the STI region 14'' may remain substantially vertical, with no etching occurring at interfaces of the sacrificial material 14''' with the STI region 14''. The sacrificial material 14''' may be subjected to the ammonium fluoride chemical treatment, as previously described, converting a portion of the sacrificial material 14''' to the solid reaction product 40. FIG. 4B illustrates a semiconductor structure 300 having the solid reaction product 40 on the sacrificial material 14'''. Without being bound by a particular theory, it is believed that the solid reaction product 40 prevents or inhibits etching of the sidewalls 306 of the STI region 14''. The solid reaction product 40 may be removed by subjecting the semiconductor structure 300 to the plasma treatment, as previously described. Depending on the thickness of the sacrificial material 14''', substantially all of the sacrificial material 14''' may be removed by a single cycle of the ammonium fluoride chemical treatment and the plasma treatment. Alternatively, multiple cycles of the ammonium fluoride chemical treatment and the plasma treatment may be performed. A gate oxide layer 308 may be formed over the substrate 12 by techniques known in the art to form semiconductor structure 300, as illustrated in FIG. 4C. The semiconductor structure 300 may be subjected to additional processing, as known in the art, to form an active area over the gate oxide layer 308 on the substrate 12.

If the semiconductor structure 300 includes exposed layers (not shown) formed from other silicon oxide materials, the semiconductor structure 300 may be exposed to the ammonium fluoride chemical treatment/plasma treatment process, as described above, to remove the sacrificial material 14''' without removing these other silicon oxide materials. By way of non-limiting examples, these other silicon oxide materials may include, but are not limited to, TEOS, PSG, or BPSG.

The semiconductor structures 2, 10, 100, and 300 described above may be further processed by conventional techniques to produce memory devices including, but not limited to, a NAND FLASH device, a dynamic random access memory ("DRAM") device, or other semiconductors devices. The memory or other semiconductor device may be used in wireless devices, personal computers, or other electronic devices, without limitation.

While the invention is susceptible to various modifications as well as alternative forms and implementations, specific embodiments have been shown in the drawings and have been described in detail herein. However, the scope of the invention is not limited to the particular embodiments disclosed. Rather, the invention, in various embodiments, encompasses all modifications, equivalents, and alternatives falling within the scope of the invention as defined by the following appended claims and their legal equivalents.

What is claimed is:

1. A gaseous composition consisting of a hydrogen fluoride gas, an alkylated ammonia derivative gas, and an inert carrier gas.

2. The gaseous composition of claim 1, wherein the alkylated ammonia derivative gas comprises an amine compound selected from the group consisting of methyl amine, dimethyl amine, trimethyl amine, ethyl amine, diethyl amine, triethyl amine, isopropyl amine, dipropyl amine, n-propyl amine, n-butyl amine, sec-butyl amine, t-butyl amine, and mixtures thereof.

3. The gaseous composition of claim 1, wherein the inert carrier gas comprises at least one of argon, xenon, neon, and helium.

4. The gaseous composition of claim 1, wherein hydrogen fluoride gas and the alkylated ammonia derivative gas together constitute from approximately 0.05% by volume to approximately 20% by volume of the gaseous composition.

5. The gaseous composition of claim 1, wherein the gaseous composition comprises a volumetric ratio of the hydrogen fluoride gas to the alkylated ammonia derivative gas of between approximately 1:1 and approximately 1:2.

6. The gaseous composition of claim 1, wherein the alkylated ammonia derivative gas comprises a molecular formula of $R_xNH_{3-x}$, where x is an integer greater than or equal to one and R is an alkyl group.

7. The gaseous composition of claim 6, wherein the alkyl group comprises at least one of a methyl group, an ethyl group, a propyl group, and a butyl group.

8. The gaseous composition of claim 1, wherein the gaseous composition is devoid of particulate matter.

9. A gaseous composition consisting of a hydrogen fluoride gas, an alkylated ammonia derivative gas, and a non-reactive gas.

10. The gaseous composition of claim 9, wherein the alkylated ammonia derivative gas comprises methyl amine.

* * * * *

UNITED STATES PATENT AND TRADEMARK OFFICE
CERTIFICATE OF CORRECTION

| | | |
|---|---|---|
| PATENT NO. | : 9,005,473 B2 | Page 1 of 1 |
| APPLICATION NO. | : 13/570866 | |
| DATED | : April 14, 2015 | |
| INVENTOR(S) | : Mark W. Kiehlbauch, J. Neil Greeley and Paul A. Morgan | |

It is certified that error appears in the above-identified patent and that said Letters Patent is hereby corrected as shown below:

In the claims:
CLAIM 4, COLUMN 12, LINE 33, change "wherein hydrogen" to --wherein the hydrogen--

Signed and Sealed this
Twenty-seventh Day of October, 2015

Michelle K. Lee
*Director of the United States Patent and Trademark Office*